(12) United States Patent
Caldwell et al.

(10) Patent No.: US 8,307,549 B2
(45) Date of Patent: Nov. 13, 2012

(54) METHOD OF MAKING AN ELECTRICAL CIRCUIT

(75) Inventors: David W. Caldwell, Holland, MI (US); Michael Jon Taylor, Longmont, CO (US); Michael L. Marshall, Byron Center, MI (US)

(73) Assignee: TouchSensor Technologies, LLC, Wheaton, IL (US)

( * ) Notice: Subject to any disclaimer, the term of this patent is extended or adjusted under 35 U.S.C. 154(b) by 218 days.

(21) Appl. No.: 10/828,997

(22) Filed: Apr. 20, 2004

(65) Prior Publication Data

US 2005/0020062 A1    Jan. 27, 2005

Related U.S. Application Data

(63) Continuation-in-part of application No. 10/272,377, filed on Oct. 15, 2002, now Pat. No. 7,218,498.

(60) Provisional application No. 60/543,883, filed on Feb. 12, 2004, provisional application No. 60/464,438, filed on Apr. 22, 2003, provisional application No. 60/341,551, filed on Dec. 18, 2001, provisional application No. 60/334,040, filed on Nov. 20, 2001.

(51) Int. Cl.
*H05K 3/02* (2006.01)
(52) U.S. Cl. .................. 29/847; 29/825; 29/846; 29/852
(58) Field of Classification Search .................... 29/825, 29/832, 840, 846, 847, 852; 430/316; 438/316
See application file for complete search history.

(56) References Cited

U.S. PATENT DOCUMENTS

| 3,757,322 | A | | 9/1973 | Barkan et al. |
|---|---|---|---|---|
| 3,864,180 | A | * | 2/1975 | Barraclough ................. 430/316 |
| 4,035,593 | A | | 7/1977 | Riniker |
| 4,090,045 | A | | 5/1978 | Marsh |
| 4,186,392 | A | | 1/1980 | Holz |
| 4,194,083 | A | | 3/1980 | Abe et al. |
| 4,205,418 | A | | 6/1980 | Przybylek |
| 4,224,615 | A | | 9/1980 | Penz |
| 4,230,967 | A | | 10/1980 | Holz et al. |
| 4,234,654 | A | * | 11/1980 | Yatabe et al. ................. 428/333 |
| 4,251,734 | A | | 2/1981 | Mayer et al. |
| 4,281,323 | A | | 7/1981 | Burnett et al. |
| 4,326,929 | A | * | 4/1982 | Minezaki et al. ............... 205/78 |
| 4,471,177 | A | | 9/1984 | Doughty |
| 4,571,454 | A | | 2/1986 | Tamaru et al. |
| 4,586,988 | A | | 5/1986 | Nath et al. |

(Continued)

FOREIGN PATENT DOCUMENTS

DE    9112597 U1    6/1992

(Continued)

OTHER PUBLICATIONS

International Preliminary Examination Report Dated Oct. 4, 2006.

(Continued)

*Primary Examiner* — C. J Arbes
(74) *Attorney, Agent, or Firm* — Barnes & Thornburg LLP

(57) ABSTRACT

A layer of transparent conductive material is disposed on a surface of a substrate. Further layers of conductive material are deposited on the layer of transparent conductive material or on an opposite surface of the substrate. The layers are selectively etched to yield a layout of pads for mounting electrical components and conductive traces forming an electrical circuit.

26 Claims, 4 Drawing Sheets

U.S. PATENT DOCUMENTS

| | | | |
|---|---|---|---|
| 4,893,115 A | 1/1990 | Blanchard | |
| 4,901,074 A | 2/1990 | Sinn et al. | |
| 5,113,041 A | 5/1992 | Blonder | |
| 5,239,152 A | 8/1993 | Caldwell et al. | |
| 5,296,096 A | 3/1994 | Enomoto et al. | |
| 5,366,588 A | 11/1994 | Scholten et al. | |
| 5,442,373 A | 8/1995 | Nomura et al. | |
| 5,534,892 A | 7/1996 | Tagawa | |
| 5,552,568 A | 9/1996 | Onodaka et al. | |
| 5,565,658 A | 10/1996 | Gerpheide et al. | |
| 5,594,222 A | 1/1997 | Caldwell | |
| 5,626,948 A | 5/1997 | Ferber et al. | |
| 5,869,790 A | 2/1999 | Shigetaka et al. | |
| 5,896,127 A | 4/1999 | Matsufusa et al. | |
| 6,093,477 A | 7/2000 | Matsufusa et al. | |
| 6,137,072 A | 10/2000 | Martter et al. | |
| 6,177,918 B1 | 1/2001 | Colgan et al. | |
| 6,184,872 B1 | 2/2001 | Matsufusa et al. | |
| 6,239,788 B1 | 5/2001 | Nohno et al. | |
| 6,310,614 B1 | 10/2001 | Maeda | |
| 6,356,259 B1 | 3/2002 | Maeda | |
| 6,483,498 B1 | 11/2002 | Colgan et al. | |
| 6,522,322 B1 | 2/2003 | Maeda et al. | |
| 6,585,435 B2 | 7/2003 | Fang | |
| 6,756,973 B2 | 6/2004 | Sano et al. | |
| 6,879,317 B2 | 4/2005 | Quinn et al. | |
| 6,911,973 B2 | 6/2005 | Katsuki et al. | |
| 7,136,049 B2 | 11/2006 | Muraoka et al. | |
| 7,176,903 B2 | 2/2007 | Katsuki et al. | |
| 7,242,393 B2 | 7/2007 | Caldwell | |
| 7,307,625 B2 | 12/2007 | Kurashima et al. | |
| 7,324,096 B2 | 1/2008 | Nakazawa et al. | |
| 7,532,131 B2 | 5/2009 | Schaefer et al. | |
| 2002/0171634 A1 | 11/2002 | Matsufusa | |
| 2002/0186210 A1 | 12/2002 | Itoh | |
| 2003/0025679 A1 | 2/2003 | Taylor et al. | |
| 2003/0043122 A1 | 3/2003 | Suzuki | |
| 2003/0122794 A1 | 7/2003 | Caldwell | |
| 2004/0078970 A1* | 4/2004 | Naitoh et al. | 29/852 |
| 2005/0006213 A1 | 1/2005 | Engelmann | |

FOREIGN PATENT DOCUMENTS

| | | | |
|---|---|---|---|
| EP | 0 265 110 | * | 4/1988 |
| EP | 265110 A1 | | 4/1988 |
| EP | 0421476 A2 | | 4/1991 |
| JP | 59-119429 U | | 8/1984 |
| JP | 63113585 A | | 5/1988 |
| JP | 02-067522 | * | 3/1990 |
| JP | 03-221922 | * | 9/1991 |
| JP | 04-032195 | | 2/1992 |
| JP | 04-032195 A | * | 2/1992 |
| JP | 04-069979 | | 3/1992 |
| JP | 04-069979 A | * | 3/1992 |
| JP | 5005899 A | | 1/1993 |
| JP | 05-114329 | | 5/1993 |
| JP | 06-242875 | | 2/1994 |
| JP | 6060744 A | | 3/1994 |
| JP | 07-140487 | * | 6/1995 |
| JP | 8292451 A | | 11/1996 |
| JP | 2001013518 A | | 1/2001 |
| JP | 2001-503205 | | 6/2001 |
| WO | 96/013098 | | 5/1996 |
| WO | WO 99/30272 A | | 6/1999 |

OTHER PUBLICATIONS

International Search Report.
English translation of Office Action from Japan Patent Office dated Oct. 30, 1009 relating to Japanese Patent Application No. 2006-513188 corresponding to this application.
Translation of Office Action issued May 24, 2010 in related JP Appl. No. 2006-513188.
Office Action issued Mar. 26, 2009, in related application No. AU 2004232038 (2009).
Office Action issued Apr. 15, 2009, in related application No. AU 2004231587 (2009).
Office Action issued Aug. 7, 2007, in related application No. EP04760080 (2007).
Office Action issued Nov. 17, 2006, in related application No. EP04760119 (2006).
Office Action issued Apr. 21, 2008, in related application No. EP04760119 (2008).
Summons of Oral Proceedings issued Apr. 12, 2010, in related app. No. EP04760119 (2010).
Office Action issued Sep. 23, 2008, in related app. No. IN 2037/KOLNP/2005-C (2008).
Office Action issued Sep. 17, 2009, in related app. No. IN 2037/KOLNP/2005-C (2009).
Office Action issued Jul. 10, 2009, in related application No. JP 2006-513217 (2009).
Office Action issued Feb. 5, 2010, in related application No. JP 2006-513217 (2010).
Office Action issued Jul. 20, 2007, in related patent No. NZ543242 (2007).
Office Action issued Mar. 22, 2007, in related patent No. NZ543243 (2007).

* cited by examiner

METHOD OF MAKING AN ELECTRICAL CIRCUIT

CROSS REFERENCE TO RELATED APPLICATIONS

This application claims priority from U.S. Provisional Patent Applications Ser. No. 60/464,438, entitled "Copper Bus on ITO Circuit," filed on Apr. 22, 2003, and No. 60/543,883, entitled "Process to Make Copper Bus on ITO Circuit," filed on Feb. 12, 2004, the disclosures of which are incorporated herein by reference. This application further claims priority as continuation-in-part from U.S. patent application No. 10/272,377, filed Oct. 15, 2002, now U.S. Pat. No. 7,218,498, which in turn claims benefit of U.S. Provisional Patent Application No. 60/334,040, filed Nov. 20, 2001, and U.S. Provisional Patent Application No. 60/341,551, filed Dec. 18, 2001.

BACKGROUND OF THE INVENTION

1. The Technical Field

The present invention is directed to electrical circuit substrates, particularly electrical circuit substrates including transparent electrodes and other electrodes and circuit elements. The present invention is further directed to fabrication of such substrates and fabrication of electrical circuits using such substrates.

2. The Related Art

Transparent touch panel substrates and transparent circuitry, for example, indium tin oxide (ITO) electrodes or traces on a glass panel or flexible substrate, are known in the art of touch panel design. These features can improve a user interface by allowing the user to view, for example, decoration or other indicia, through the touch panel and allowing panel backlighting to reach the user.

Though such panels often are desirable, their designers are faced with certain obstacles. For example, transparent conductors generally exhibit poor solderability characteristics and, therefore, are not well-suited for receiving and connecting to other electrical circuit components, such as resistors, capacitors, transistors and integrated circuits. Also, transparent conductors are not ideal electrical conductors. Indeed, the conductivity of ITO, a commonly used transparent conductor, is generally inferior to that of copper or other commonly used electrical conductors. For this reason, designers often limit use of transparent conductors to those areas of an touch panel where transparency is required, and they generally prefer to use conventional conductors, such as copper, where transparency is not required.

However, difficulties arise in implementing the numerous interfaces that may exist between transparent and conventional circuit portions. For example, transparent and conventional circuit portions often are built on separate substrates which are subsequently connected physically and electrically. Connecting such separate substrates together requires precise alignment which can be adversely affected by stack up of tolerances among the various components to be joined. Connecting separate substrates together also requires precise joining techniques, such as use of compression connectors, anisotropic adhesives, and silver or other metal filled ink to bridge transparent and other circuit portions. Once joined, separate boards connected in this manner are prone to electrical and/or physical separation after initial assembly and during use due to handling, vibration, and differential shrinkage and expansion between the two boards. Further, application of the foregoing techniques tends to limit the minimum pitch or spacing between individual touch pads, thus placing limits on the compactness of an overall touch panel.

Attempts have been made to incorporate both transparent and conventional conductive circuit portions on a single substrate. However, these attempts have involved application of a transparent conductive layer over a conventional conductive layer using screen printing process and/or serial patterning and etching of thin films. For example, one such attempt involves applying a thin film of copper to a substrate, plating additional copper onto the copper film, patterning and etching the copper layer, applying a thin film of transparent conductive material to the substrate and conventional circuit portions and then patterning and etching the transparent conductive material layer. These steps involve various different processes that traditionally are carried out on different production lines. As such, this technique is relatively time consuming and costly. Further, the resulting structure inherently yields sharp transitions at junctions between transparent and conventional circuit portions because of the nature in which the transparent layer overlaps the conventional circuit portions. These sharp transitions result in unreliable electrical connections between the transparent and conventional circuit portions.

SUMMARY OF THE INVENTION

The present invention is directed to electrical circuit platforms having multiple thin film conductive layers and methods for making and using them. In a preferred embodiment, a layer of conductive material, preferably transparent, is disposed on a surface of a rigid or flexible dielectric substrate. One or more additional layers of conductive material are disposed on the first layer and/or on the opposite surface of the substrate. The several layers are selectively masked and etched to yield a desired pattern of bonding pads for mounting of electrical components and conductive traces forming an electrical circuit.

A flexible electrical circuit platform can be produced in bulk by unrolling a flexible substrate from a supply roll, feeding the substrate through an apparatus that applies conductive layers thereto on a continuous or indexed basis, and rolling the substrate with conductive layers applied onto a take-up roll.

DETAILED DESCRIPTION OF THE ILLUSTRATED EMBODIMENTS

Figure 1:
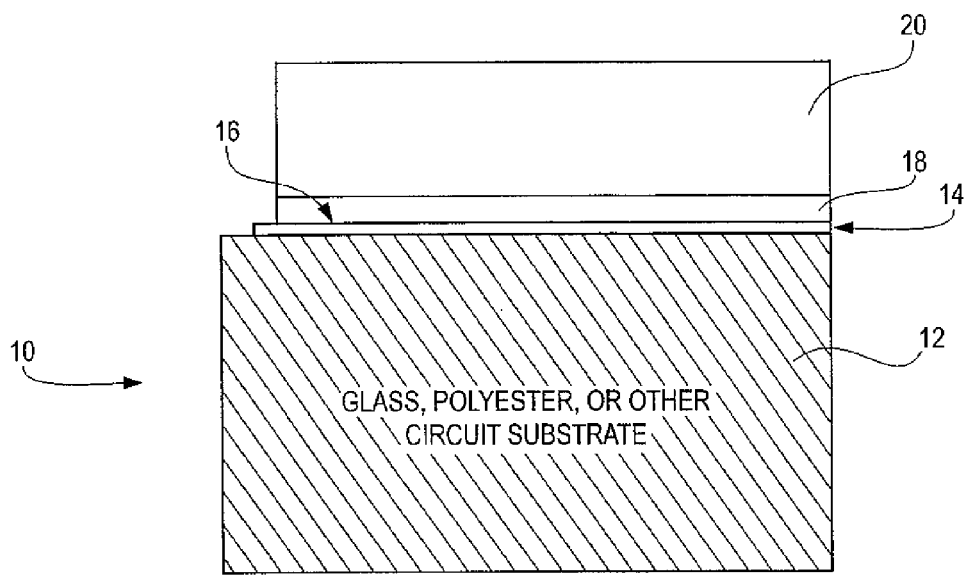
FIG. 1 is a cross-sectional view of an electrical circuit platform comprising a substrate with multiple conductive layers thereon according to the present invention.

FIG. 1 illustrates in cross-section an embodiment of an electrical circuit platform 10 comprising a substrate with multiple conductive layers according to the present invention. Substrate 12 can be made of any rigid or flexible material suitable for use as an electrical circuit substrate, for example, glass, polyester film, resin and the like. Although it can be opaque, substrate 12 preferably is transparent or translucent, particularly when used in applications involving backlighting which is to penetrate substrate 12. Substrate 12 can, but need not, include graphics or other decoration.

In the FIG. 1 embodiment, transparent conductive layer 14 is disposed on substrate 12. Transparent conductive layer 14 can be any suitable transparent conductive material applied to a suitable thickness, as would be known to one skilled in the art. (The term "conductive material" as used herein includes semi-conductive materials that one skilled in the art would know to use for the purposes described.) In a preferred embodiment, transparent conductive layer 14 is a layer of ITO having a thickness yielding a resistivity of 50-200 ohms per square, but thicknesses yielding a resistivity of from 5-1000 ohms per square are deemed to yield acceptable results. Other material thicknesses might also be acceptable. In alternate embodiments, transparent conductive layer 14 could be a suitable layer of gold, chrome, or other conductive material that is substantially transparent in thin-film form.

Any suitable technique can be used for depositing transparent conductive layer 14 onto substrate 12. Preferred techniques for depositing transparent conductive layer 14 onto substrate 12 include sputtering, vapor deposition, evaporative and vacuum processes using hot and cold pressed and other ITO targets, as would be known to one skilled in the art. Sputtering techniques, such as DC magnetron sputtering, are particularly advantageous in that they can be used with flat, shaped, cylindrical and rotatable targets, among others. Substrate 12 can be treated prior to deposition of transparent conductive layer 14 to improve the adhesion of the transparent layer to the substrate. For example, the surface of substrate 12 onto which transparent conductive layer 14 is to be deposited can be roughed up using any suitable technique. Glow discharge, RF plasma and other energetic techniques are deemed to yield good results in this regard.

An optional interfacial layer 16 is disposed on transparent conductive layer 14. Although interfacial layer 16 is not essential to the invention, it might be desirable in certain embodiments to improve adhesion of further conductive layers, as discussed below, to transparent conductive layer 14. Further, interfacial layer 16 might be desirable for its optical properties. Interfacial layer 16, when used, preferably is transparent to permit the user to view backlighting or decoration on or opposite substrate 12. Interfacial layer 16 can have optical characteristics similar to those of substrate 12 and/or transparent conductive layer 14 to ensure transparency of this combination of elements. Alternatively, the optical characteristics of substrate 12, transparent conductive layer 14 and interfacial layer 16 can be selected so that this combination of elements acts as an optical filter. For example, the optical characteristics of these elements can be selected to filter certain wavelengths of light and allow only other wavelengths to penetrate them. Various materials can be used for interfacial layer 16, for example, chromium or oxides of niobium. These materials can be applied by sputtering or other suitable techniques to a suitable thickness, for example, 400-10,000 angstroms.

Conventional conductive layer 18 is disposed on interfacial layer 16. In embodiments where interfacial layer 16 is omitted, conventional conductive layer 18 would be disposed on transparent conductive layer 14. Conventional conductive layer 18 can be any suitable conductive material, for example, copper, aluminum or gold, applied to a suitable thickness. Copper is preferred based on considerations of cost, conductivity and ease of soldering. In a preferred embodiment, conventional conductive layer 18 is copper deposited to a thickness yielding a resistivity of less than 0.025 ohms per square. In practice, copper thicknesses from 400-10,000 angstroms are deemed acceptable. Other material thicknesses might be acceptable, as well. Any suitable technique can be used for depositing conventional conductive layer 18 onto interfacial layer 16 (or onto transparent conductive layer 14 where interfacial layer 16 is not used). Preferred techniques for depositing conventional conductive layer 18 include sputtering, vapor deposition, evaporative, and vacuum processes, among others, as would be known to one skilled in the art.

A conventional conductive layer 18 having a thickness yielding a resistivity of less than 0.025 ohms per square is deemed to provide acceptable electrical properties for circuits built onto electrical circuit platform 10 and to permit soldering of circuit components, for example, resistors, capacitors and integrated circuits to conventional conductive layer 18. Nevertheless, a circuit designer might desire, or an application might require, a thicker conductive layer. This need can be satisfied by depositing conventional conductive layer 18 to a sufficient thickness. Alternatively, as illustrated in FIG. 1, an additional layer of conductive material 20 can be deposited onto conventional conductive layer 18 using any suitable technique, for example, electroplating.

In an alternate embodiment (not shown), the opposite side of substrate 12 also is prepared in the manner described above to yield a two-sided electrical circuit platform 10. In another alternate embodiment (not shown), transparent conductive layer 14 is applied to a first side of substrate 12 and conventional conductive layer 18 is applied to a second side of substrate 12. An additional layer of conductive material 20 can be disposed on such conventional conductive layer 18. A further layer (not shown) could be disposed on either side of substrate 12, upon or underneath the various conductive layers, to improve adhesion or for optical purposes, as discussed above. Transparent conductive layer 14 and conventional conductive layer 18 would be electrically connected using a via that penetrates substrate 12. In this embodiment, substrate 12 can be pre-drilled or pre-punched to facilitate such electrical connection.

Figure 2:
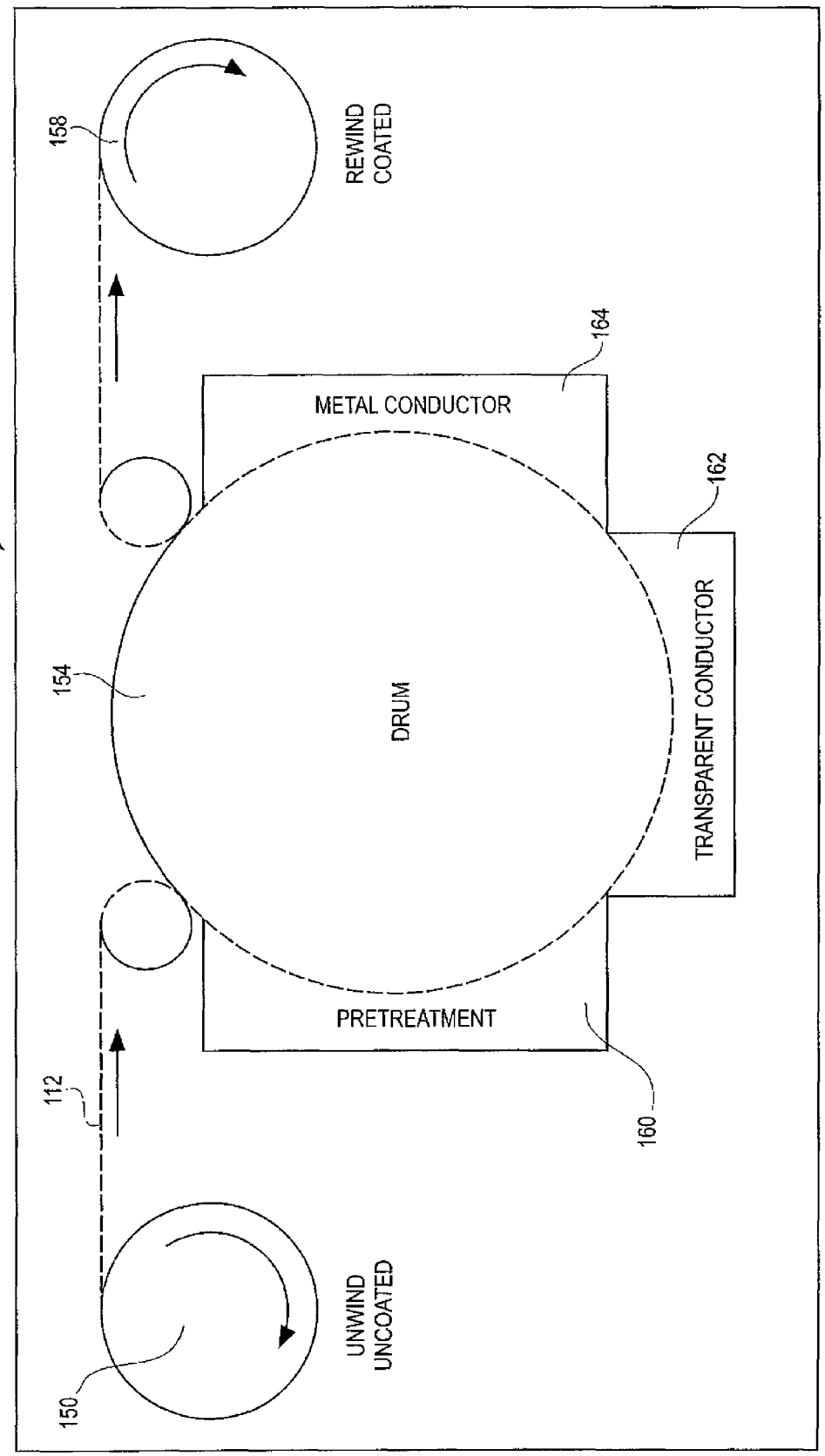
FIG. 2 is a schematic representation of a process and system for preparing an electrical circuit platform with multiple conductive layers thereon according to the present invention.

FIG. 2 illustrates schematically a preferred process and system for bulk fabrication of a flexible electrical circuit platform 10 generally having the structure described above and illustrated in FIG. 1. This process takes advantage of the fact that flexible electrical substrate materials, for example, polyethylene terephthalate, polyethylene napthalate, and other dielectric films suitable for use in connection with electrical circuits having transparent conductors are available in bulk on spools, such as spool 150. (Such films typically have a thickness of 12 to 125 microns.) In the FIG. 2 embodiment, flexible substrate 12 is unwound from supply spool 150 and supported by drum 154 during processing. Such processing includes deposition of transparent conductive material 14 at station 162 and deposition of conventional conductive material 18 at station 164. Such processing can also include deposition of an interfacial layer (not shown) and pretreatment of substrate 12 at station 160, where substrate 12 is cleaned and otherwise prepared for receiving conductive layers 14 and 18 and the optional interfacial layer. The resultant flexible electrical circuit platform 10 is wound onto take-up spool 158. The foregoing process preferably takes place inside a vacuum chamber 166 to reduce the potential for contamination of substrate 12 and the thin film layers deposited thereon, and to assist in forming an intimate, ohmic bond between the various thin film layers.

Similar process steps can be used to prepare electrical circuit platform 10 from raw substrate material provided in another form. For example, electrical circuit platform 10 can be made from a panel of rigid or flexible raw substrate material by using conventional processes for pretreating the raw substrate material, applying a transparent conductive layer, applying an interfacial layer, and/or applying one or more conventional conductive layers.

Figure 3:
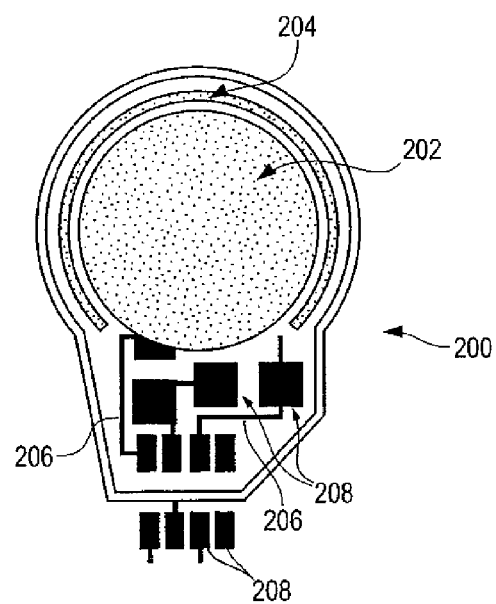
FIG. 3 is a plan view of an electrical circuit built on an electrical circuit platform comprising a substrate with multiple conductive layers thereon according to the present invention.

Electrical circuit platform 10 can be used as a printed wiring board for the fabrication of electrical circuits by selectively etching conventional conductive layer 18 and transparent conductive layer 14 to yield conductive pads for mounting discrete circuit components, for example, resistors, capacitors, transistors and integrated circuits, and conductive circuit traces for interconnecting circuit components. FIG. 3 illustrates an electrical circuit platform embodying the present invention, wherein the conventional conductive layer and transparent conductive layer have been selectively etched to yield a platform 200 for a proximity sensor. Proximity sensor platform 200 includes a transparent conductive inner touch pad electrode 202, a transparent conductive outer touch pad electrode 204, conventional conductive traces 206 and conventional conductive bonding pads 208 which can receive discrete electrical components, as described above. For clarity, such discrete circuit components are not shown in FIG. 3.

Figure 4:
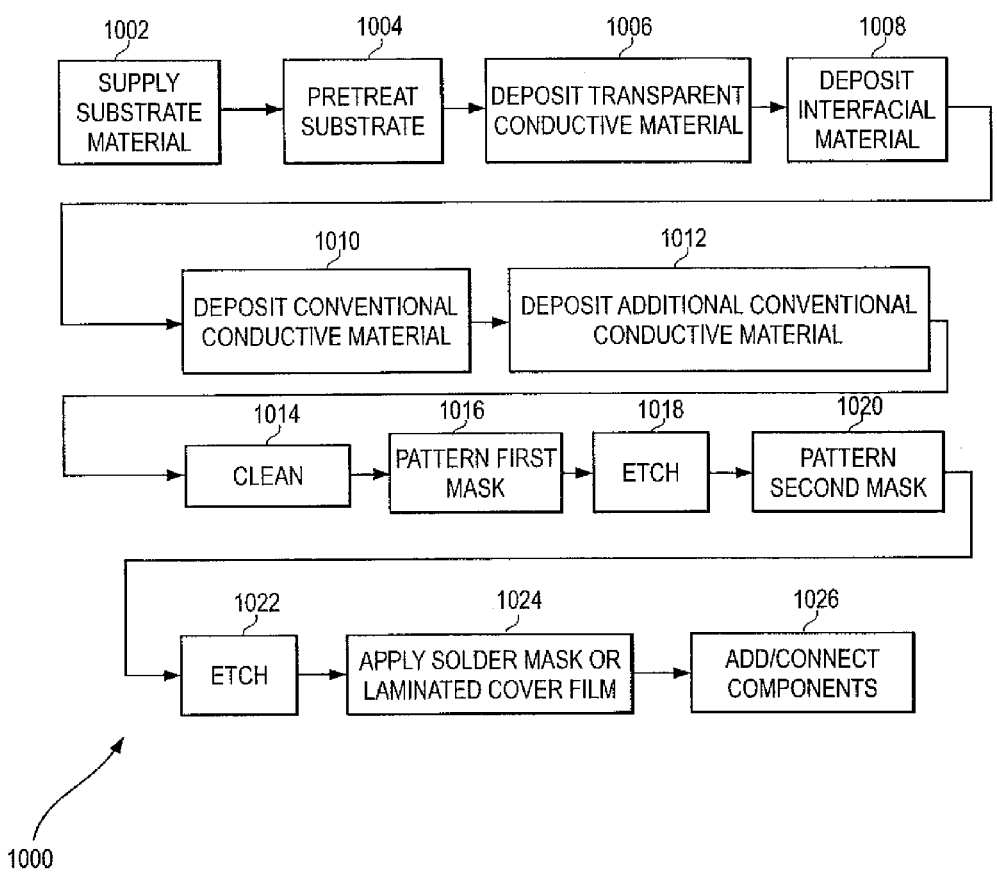
FIG. 4 is a flowchart representation of a process for making an electrical circuit built on an electrical circuit platform comprising a substrate with multiple conductive layers thereon according to the present invention.

FIG. 4 illustrates in flow chart form a method 1000 for making and using an electrical circuit platform 10 according to the present invention. Raw substrate material is provided at step 1002 and pretreated at step 1004, as necessary, to remove surface contaminants that might be present. Transparent conductive material is deposited onto the substrate at step 1006. Optionally, interfacial layer is deposited onto the transparent conductive material layer at step 1008. Conventional conductive material is deposited onto the transparent layer (or onto the interfacial layer, when used) at step 1010. Optionally, further conductive material is deposited onto the conventional conductive layer at step 1012.

Thus-prepared platform 10 is cleaned at step 1014 using any suitable technique, for example chemical or plasma etching. A first mask is patterned onto conventional conductive layer 18 at step 1016 using any suitable technique, for example, high resolution lithography and photoresist techniques. Preferably, this first mask mimics the desired conventional conductive material electrical trace and pad design. One example of such a design is shown in, and described above in connection with, FIG. 3. At step 1018, platform 10 is bathed in or otherwise subjected to a first etchant that etches the un-patterned portions of conventional conductive layer 18 (and additional conductive layer 20, if used), but that does not etch underlying transparent layer 14 (or that etches transparent layer 14 at a slower rate than it etches conventional layer 18 and/or additional layer 20). In embodiments where interfacial layer 16 was applied between transparent conductive layer 14 and conventional conductive layer 18, the first etchant can be elected so that it does or does not also etch interfacial layer 16. Upon completion of step 1018, electrical circuit platform 10 comprises a substrate underlying a substantially intact layer of transparent conductive material and an overlying arrangement of electrical circuit traces and pads comprising conventional conductive material (with a like arrangement of interfacial material between the conventional and transparent conductive material layers, in embodiments using an interfacial layer). In embodiments where interfacial layer 16 was applied between transparent conductive layer 14 and conventional conductive layer 18, interfacial layer 16 may or may not be substantially intact atop transparent conductive layer 14 depending on the etchant used.

At step 1020, a second mask is patterned onto transparent conductive layer 14 or onto interfacial layer 16, if used and if not etched by the first etchant. Preferably, this second mask mimics the desired transparent conductive material electrical trace design, as shown in, and described above in connection with, FIG. 3. At step 1022, platform 10 is bathed in or otherwise subjected to a second etchant that etches the unpatterned portions of transparent layer 14 and the unpatterned portions of interfacial layer 16, if used and if not etched by the first etchant, but not conventional conductive layer 18 (or additional layer 20, if present) (or that etches layers 18, 20 at a slower rate than it etches the transparent layer). (In embodiments using interfacial layer 16, additional steps, not shown, can be taken to mask and etch interfacial layer 16 separate from conventional conductive layers 18,20 and transparent conductive layer 14.) In effect, conventional conductive layer 18 and/or additional layer 20 act as a mask in etching step 1022. Upon completion of step 1022, electrical circuit platform 10 bears the desired pattern of transparent and conventional electrodes and bonding pads. One example of such a pattern is shown in, and described in connection with, FIG. 3.

Optionally at step 1024, a solder mask or laminated cover film is applied to cover the conductive pads and traces resulting from the foregoing patterning and etching steps. Discrete circuit components are added and electrically connected to the conductive pads and traces at step 1026. Additional cleaning, drying, component attachment, and other steps can be used in the foregoing process, as desired or necessary, as would be known to one skilled in the art.

Figure 5:
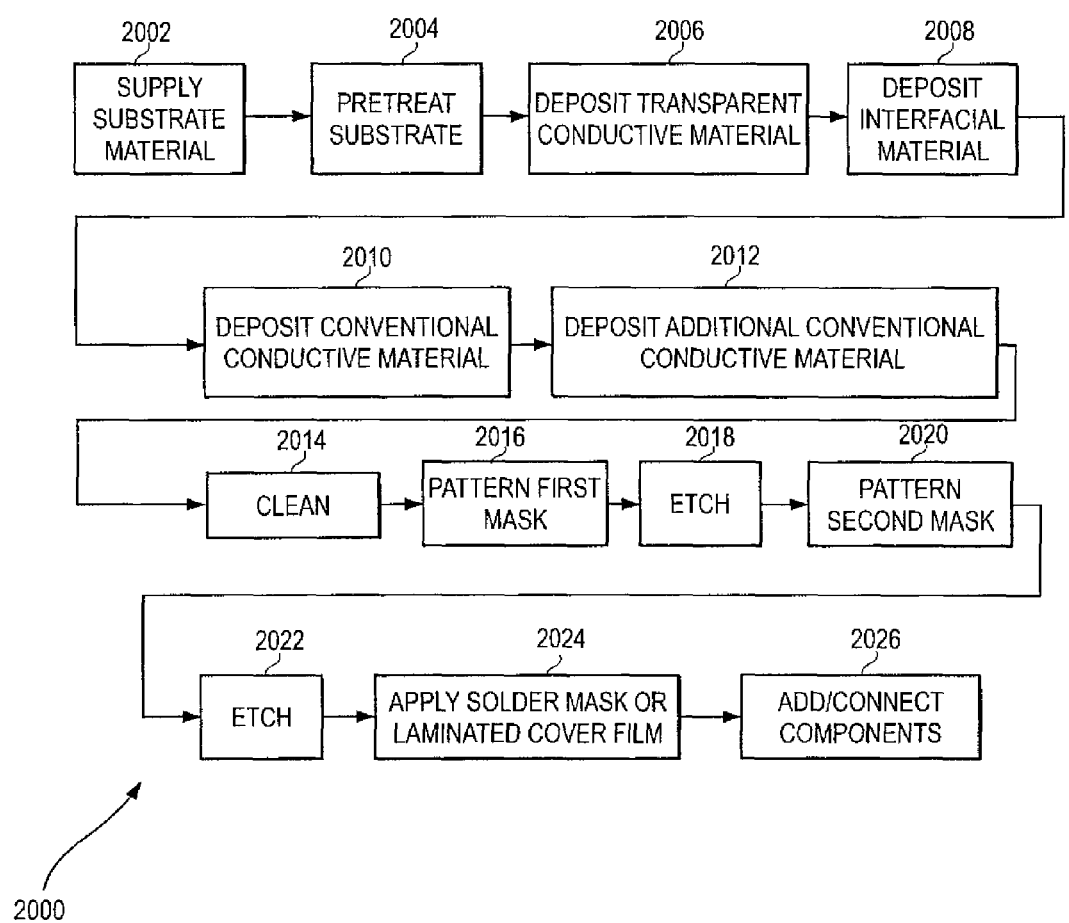
FIG. 5 is a flowchart representation of an alternate process for making an electrical circuit built on an electrical circuit platform comprising a substrate with multiple conductive layers thereon according to the present invention.

FIG. 5 illustrates in flow chart form an alternate method 2000 for making and using an electrical circuit platform 10 according to the present invention. Steps 2002 through 2014 parallel steps 1002 through 1016 described above. At step 2016, a first mask is patterned onto conventional conductive layer 18 at step 1016 using any suitable technique, for example, high resolution lithography. Preferably, this first mask mimics the overall electrical trace and bonding pad design (comprising both transparent conductive portions and conventional conductive portions). One example of such a pattern is shown in, and described above in connection with, FIG. 3. At step 2018, platform 10 is bathed in or otherwise subjected to an etchant that etches the un-patterned portions of additional conductive layer 20 (if present), conventional conductive layer 18, interfacial layer 16 (if present), and transparent layer 14. Upon completion of step 2018, electrical circuit platform 10 bears the desired pattern of transparent and conventional electrodes and bonding pads, except that the transparent conductive portions have an overlying layer of conventional conductive material (as well as overlying layers of interfacial material and additional conventional conductive material, if used). If used, interfacial layer 16 can be etched as described above in connection with FIG. 4.

At step 2020, a second mask is patterned onto conventional conductive layer 18 using any suitable technique, for example, high resolution lithography. Preferably, this second mask mimics the desired conventional conductive material electrical trace and pad design. At step 2022, platform 10 is bathed in or otherwise subjected to an etchant that etches the unpatterned portions of conventional conductive layer 18 (and additional layer 20, if present), but not underlying transparent conductive layer 14 (or that etches transparent conductive layer 14 at a slower rate than it etches layers 18, 20). In this manner, conventional conductive layer 18 and/or additional layer 20 act as a mask in etching step 2022. Upon completion of step 2022, electrical circuit platform 10 bears the desired pattern of transparent and conventional electrodes and bonding pads, for example, the structure shown in, and described in connection with, FIG. 3.

While several embodiments of the present invention have been shown and described above, it will be obvious to those skilled in the art that numerous modifications made be made without departing from the spirit of the invention, the scope of which is defined by the claims below.

We claim:

1. A method for fabricating an electrical circuit, comprising the steps of:
    depositing a layer of a first conductive material onto a surface of a flexible substrate, wherein said layer of a first conductive material is substantially transparent and wherein at least a portion of said substrate is translucent or transparent;
    depositing a layer of a second conductive material onto said layer of a first conductive material;
    depositing an additional layer of conductive material onto said layer of a second conductive material;
    selectively etching said layer of additional conductive material;
    selectively etching a portion of said layer of a second conductive material; and
    selectively etching a portion of said layer of a first conductive material.

2. The method of claim 1 wherein said first conductive material is indium tin oxide.

3. The method of claim 1 wherein said second conductive material is a conventional conductive material.

4. The method of claim 3 wherein said second conductive material is copper.

5. The method of claim 1 wherein said steps of selectively etching occur after said steps of depositing.

6. The method of claim 5 further comprising the steps of:
    providing said flexible substrate on a supply roll; and
    unrolling said flexible substrate from said supply roll;
    wherein said steps of depositing said layer of a first conductive material onto said flexible substrate and depositing said layer of a second conductive material onto said layer of a first conductive material are conducted on a continuous basis.

7. The method of claim 6 further comprising the step of rolling said flexible substrate with said layers of conductive material applied thereto onto a take-up roll.

8. The method of claim 1 wherein said additional layer of conductive material is deposited by electroplating.

9. The method of claim 3 further comprising the step of electrically connecting an electrical component to said second conductive material.

10. The method of claim 5 wherein said step of electrically connecting said electrical component to said second conductive material comprises soldering said electrical component to said second conductive material.

11. The method of claim 1 wherein said layer of second conductive material is substantially transparent.

12. The method of claim 1 wherein said second conductive material is an oxide of niobium.

13. The method of claim 11 wherein said additional layer of conductive material comprises a conventional conductive material.

14. The method of claim 1 further comprising the step of electrically connecting an electrical component to said additional layer of conductive material.

15. The method of claim 14 wherein said step of electrically connecting said electrical component to said additional layer of conductive material comprises soldering said electrical component to said additional layer of conductive material.

16. The method of claim 1 wherein at least one of said steps of depositing occurs in a substantial vacuum.

17. The method of claim 1 further comprising the step of pretreating said surface of said substrate to enhance adhesion of said layer of first conductive material to said substrate.

18. The method of claim 1 further comprising the step of patterning said layer of a second conductive material to define said portion of said layer of a second conductive material to be etched in connection with said step of etching said layer of a second conductive material.

19. The method of claim 18 further comprising the step of patterning said layer of a first conductive material to define said portion of said layer of a first conductive material to be etched in connection with said step of etching said layer of a first conductive material.

20. The method of claim 1 further comprising the step of patterning said layer of a first conductive material to define said portion of said layer of a first conductive material to be etched in connection with said step of etching said layer of a first conductive material.

21. The method of claim 1 wherein said step of selectively etching said layer of a second conductive material is performed using an etchant that is selected to etch said layer of a second conductive material and to not substantially etch said layer of a first conductive material.

22. The method of claim 1 wherein said substrate is supplied to and taken up from a support drum that supports said substrate during said steps of depositing.

23. The method of claim 13 wherein said additional layer of conductive material comprises copper.

24. A method for fabricating an electrical circuit, comprising the steps of:
    depositing a layer of a first conductive material onto a surface of a substrate, either directly or in connection with an intermediary layer between said layer of a first conductive material and said surface of a substrate;
    depositing a layer of a second conductive material onto said layer of a first conductive material in connection with an interfacial layer deposited between said layer of a second conductive material and said layer of a first conductive material;
    selectively etching a portion of said layer of a second conductive material;
    selectively etching a portion of said interfacial layer; and
    selectively etching a portion of said layer of a first conductive material.

25. The method of claim 24 wherein said step of etching said layer of a second conductive material is performed using an etchant that etches said layer of a second conductive material and that does not substantially etch said layer of a first conductive material.

26. The method of claim 24 wherein said layer of a first conductive material is substantially transparent.

* * * * *